US009791491B2

(12) United States Patent
Ivan et al.

(10) Patent No.: US 9,791,491 B2
(45) Date of Patent: Oct. 17, 2017

(54) MICROPOSITIONING DEVICE WITH MULTIDEGREES OF FREEDOM FOR PIEZOELECTRIC ACTUATORS AND ASSOCIATED METHOD

(71) Applicants: Universite De Franche Comte, Besancon (FR); Ecole Nationale Superieure De Mecanique Et Des Microtechniques, Besancon (FR)

(72) Inventors: Ioan Alexandru Ivan, Besancon (FR); Joël Agnus, Besancon (FR); Manitrarivo Rakotondrabe, Besancon (FR)

(73) Assignees: UNIVERSITE DE FRANCHE COMTE, Besancon (FR); ECOLE NATIONAL SUPERIEURE DE MECANIQUE ET DES MICROTECHNIQUES, Besancon (FR)

( * ) Notice: Subject to any disclaimer, the term of this patent is extended or adjusted under 35 U.S.C. 154(b) by 469 days.

(21) Appl. No.: 14/387,006

(22) PCT Filed: Mar. 22, 2013

(86) PCT No.: PCT/FR2013/050622
§ 371 (c)(1),
(2) Date: Sep. 22, 2014

(87) PCT Pub. No.: WO2013/140102
PCT Pub. Date: Sep. 26, 2013

(65) Prior Publication Data
US 2015/0054520 A1    Feb. 26, 2015

(30) Foreign Application Priority Data
Mar. 22, 2012   (FR) ..................... 12 52554

(51) Int. Cl.
*G01N 27/60*   (2006.01)
*G01R 29/22*   (2006.01)
(Continued)

(52) U.S. Cl.
CPC ............ *G01R 29/22* (2013.01); *G01B 7/004* (2013.01); *H01L 41/09* (2013.01); *H02N 2/062* (2013.01); *H01L 41/092* (2013.01)

(58) Field of Classification Search
CPC ......... G01R 29/22; G01B 7/004; H01L 41/09; H01L 41/092; H02N 2/062
(Continued)

(56) References Cited

U.S. PATENT DOCUMENTS

| 4,945,235 A | 7/1990 | Nishioka et al. |
| 5,675,296 A | 10/1997 | Tomikawa |

(Continued)

FOREIGN PATENT DOCUMENTS

| DE | WO2008141908 A2 * | 11/2008 | ............ H02N 2/105 |
| EP | 0 375 570 | 6/1990 | |

OTHER PUBLICATIONS

English transulation of WO2008141908A2.*
(Continued)

*Primary Examiner* — Melissa Koval
*Assistant Examiner* — Courtney McDonnough
(74) *Attorney, Agent, or Firm* — Brinks Gilson & Lione; G. Peter Nichols

(57) ABSTRACT

A micropositioning device for a piezoelectric actuator includes a means for controlling an electric field applied to the piezoelectric actuator so as to deform the piezoelectric material, and means for simultaneous measurement of a variation of electric charge accumulated on the piezoelectric actuator resulting from the deformation; and means for acquiring measurements of the variation of electric charge, (Continued)

for processing these acquisitions and for estimating a displacement (x, y, z) of the piezoelectric actuator and/or an applied force.

10 Claims, 5 Drawing Sheets

(51) Int. Cl.
    *G01B 7/004*      (2006.01)
    *H01L 41/09*      (2006.01)
    *H02N 2/06*      (2006.01)

(58) Field of Classification Search
    USPC .......................................................... 324/452
    See application file for complete search history.

(56) References Cited

U.S. PATENT DOCUMENTS 6,285,115 B1*    9/2001    Gallmeyer ............. H02N 2/062
                                                                               310/317
2011/0248701 A1*   10/2011   Fuchs ................ G01R 19/0084
                                                                               324/115

OTHER PUBLICATIONS

French Application No. FR 1252554 Search Report dated Nov. 28, 2012 (2 pages).
PCT/FR2013/050622 International Search Report dated Jun. 20, 2013 (4 pages including English translation).

\* cited by examiner

MICROPOSITIONING DEVICE WITH MULTIDEGREES OF FREEDOM FOR PIEZOELECTRIC ACTUATORS AND ASSOCIATED METHOD

This application claims priority to International Application No. PCT/FR2013/050622 filed Mar. 22, 2013 and French Patent Appln. No. 1252554 filed Mar. 22, 2012; the entire contents of each are incorporated herein by reference.

BACKGROUND

The technical field of the invention is that of methods for positioning actuators, in particular piezoelectric actuators, and it relates more particularly to a micropositioning method for piezoelectric actuators and to an associated device.

The problem of micropositioning for piezoelectric actuators has already given rise to a plurality of solutions, in particular the solution consisting in voltage control of an actuator comprising a pair of electrodes, so as to deform a piezoelectric material arranged between the electrode pair.

In general, this type of device provides deformation measurement means, the sensors of which are located at the piezoelectric material (strain gauges), or means for measuring the displacement of the controlled structure, the sensors of which are located outside said structure (triangulation or interferometric optical sensors).

Nevertheless, these strain gauges have an unfavorable signal-to-noise ratio while the external sensors are very bulky, all the more so as these devices need to comprise as many sensors as there are degrees of freedom on which a measurement is to be carried out. The use of such devices is therefore limited to applications in which the space containing the measurement means is not a problem. Furthermore, these very precise devices are very expensive, the cost being commensurately higher as the number of degrees of freedom is large.

SUMMARY

The invention aims to overcome some or all of the drawbacks of the prior art, in particular the problems posed by the size and cost of the means for measuring the displacement of structures actuated by at least one voltage-controlled piezoelectric actuator.

According to a first aspect of the invention, a micropositioning device for at least one piezoelectric actuator, said piezoelectric actuator comprising at least one piezoelectric material capable of deforming when it is subjected to an electric field, characterized in that it further comprises:
  means for controlling an electric field applied to said piezoelectric actuator so as to deform the piezoelectric material, and
  means for simultaneously measuring a variation in electric charge accumulated on the piezoelectric actuator as a result of the deformation; and
  means for acquiring measurements of the electric charge variation, for processing these acquisitions and for estimating a displacement of the piezoelectric actuator and/or an applied force on the basis of the measurement of the variation in electric charge accumulated on the piezoelectric actuator,
  such that the control and measurement means further comprise:
  a voltage generator connected in parallel to:
    a divider bridge, the divider bridge being composed of a first resistor and a second resistor in series, and to
    a first capacitor connected in series with the piezoelectric actuator,
  a charge amplifier having a first input connected to a node between the two resistors, forming a virtual ground at floating high potential, and a second input connected to a node between the first capacitor and the piezoelectric actuator.

This device obviates external sensors in that it makes it possible to use the same piezoelectric material as an actuator and as its own sensor.

In other words, it is possible to obviate a measurement of the actual deformation of the piezoelectric material and/or of the displacement of the actuator and/or of the applied force by measuring the variation in the actual electric charge present on the piezoelectric actuator and by calculation (estimation algorithm) on the basis of this variation measurement of the actual electric charge.

Although this device may seem to involve a larger error in the accuracy of the measurements obtained in comparison with the prior art, it is surprisingly found that the quality of the position measurement of such an actuator is highly satisfactory, i.e. of the order of a few nanometers rms ("root mean square"), i.e. better than a triangulation optical sensor and substantially comparable with an interferometric measurement.

Furthermore, obviating the measurement sensor makes it possible to save on the procurement of said sensor, i.e. to significantly reduce the cost of the device.

Such a device furthermore makes it possible to be able to carry out simultaneous measurements of the piezoelectric material deformation according to a plurality of degrees of freedom, and to do so on devices whose dimensioning is problematic. The bulk is therefore minimal. Furthermore, such a device allows "real-time" control of the associated micropositioning device.

The device also obviates external sensors in that it makes it possible to use the same piezoelectric material as an actuator and as its own sensor.

In other words, it is possible to obviate a measurement of the actual deformation of the piezoelectric material and/or of the displacement of the actuator and/or of the applied force by measuring the variation in the actual electric charge present on the piezoelectric actuator and by algorithmic calculation on the basis of this measurement of the variation of the actual electric charge.

It should be noted that, further to a displacement of the piezoelectric actuator and/or a force applied by an external environment to said piezoelectric actuator, the estimation means may make it possible to estimate any other parameter which depends directly or indirectly on said electric charge variation measured by the measurement means.

According to a particular characteristic, the piezoelectric actuator comprises at least three distributed electrodes, including at least one ground electrode and at least two active potential electrodes. For example, the piezoelectric sensor may be a piezo tube or any other actuator with a plurality of degrees of freedom. In the case of a piezoelectric actuator of the piezo tube type, said piezo tube comprises the piezoelectric material forming the tube, the ground electrode arranged on an internal wall of the tube and at least two active potential electrodes arranged on an external wall of the tube.

The number of external electrodes preferably varies as a function of the number of degrees of freedom on which a measurement is to be carried out. Thus, in the case in which at least two active potential electrodes are used, it is possible to control the piezoelectric actuator respectively according to at least two degrees of freedom.

Advantageously, the means for controlling the electric field and for simultaneous measurement of the electric charge variation comprise at least one circuit for controlling the electric field applied to said piezoelectric actuator and for measuring the variation in charge accumulated on the active potential electrodes.

Advantageously, the charge amplifier comprises an operational amplifier and a second capacitor connected between the second input and the output of the operational amplifier.

According to another characteristic, the control and measurement means furthermore comprise a circuit for resetting to zero the charges present on the second capacitor.

The piezoelectric device being likenable at rest to a capacitor, the first capacitor and the first and second resistors are selected so that the ratio between the first and the second resistor is substantially equal to the ratio between the first resistor and the capacitor of the piezoelectric device at rest.

Advantageously, the first capacitor is selected so as to have a leakage resistance of more than 100 Gohm.

Furthermore, the first capacitor is selected so that most of the voltage delivered by the voltage generator is found on the piezoelectric device, the term "most" of the voltage meaning at least more than 50% of this voltage. Preferably, the first capacitor is selected in such a way that at least 90% of the voltage delivered by the voltage generator is found on the piezoelectric device.

In another advantageous configuration, the output of each charge amplifier is connected to an analog-digital converter connected to a computer via galvanic isolation circuits; the computer estimating the displacement of the actuator and/or the deformation of the material and/or the applied force on the basis of the charge variation received from the charge amplifiers and the voltages applied by the voltage generators. Conversely, in another embodiment, the galvanic isolation may be implemented in analog mode, in which case the analog-digital converter is arranged after the galvanic isolation circuits.

Advantageously, the piezoelectric device comprises at least three electrodes, including at least one ground electrode and at least two active potential electrodes, the device comprising as many control and measurement means as active electrodes, connected one by one, and the control and measurement means being connected to a single computer adapted to displace and measure the piezoelectric device in at least two dimensions.

According to another aspect, the invention relates to a method for micropositioning at least one piezoelectric actuator, carried out by a device as described above, characterized in that it comprises the following steps:
steps:
  of controlling the piezoelectric actuator by applying an electric field to said piezoelectric actuator so as to deform the piezoelectric material; and
  of simultaneous measurement of a variation in electric charge accumulated on the piezoelectric actuator as a result of the deformation;
  at least one step of acquiring the measurements of the electric charge variation, of processing these acquisitions and of estimating a displacement of the piezoelectric actuator and/or of the applied force on the basis of the measurement of the variation in electric charge accumulated on the piezoelectric actuator.

BRIEF DESCRIPTION OF THE DRAWINGS

Other characteristics, details and advantages of the invention will become apparent on reading the following description with reference to the appended figures, in which.

For greater clarity, elements which are the same or similar in the various embodiments are denoted by the same references throughout the figures. Their description will not be systematically repeated from one embodiment to another.

DETAILED DESCRIPTION

Figure 1:
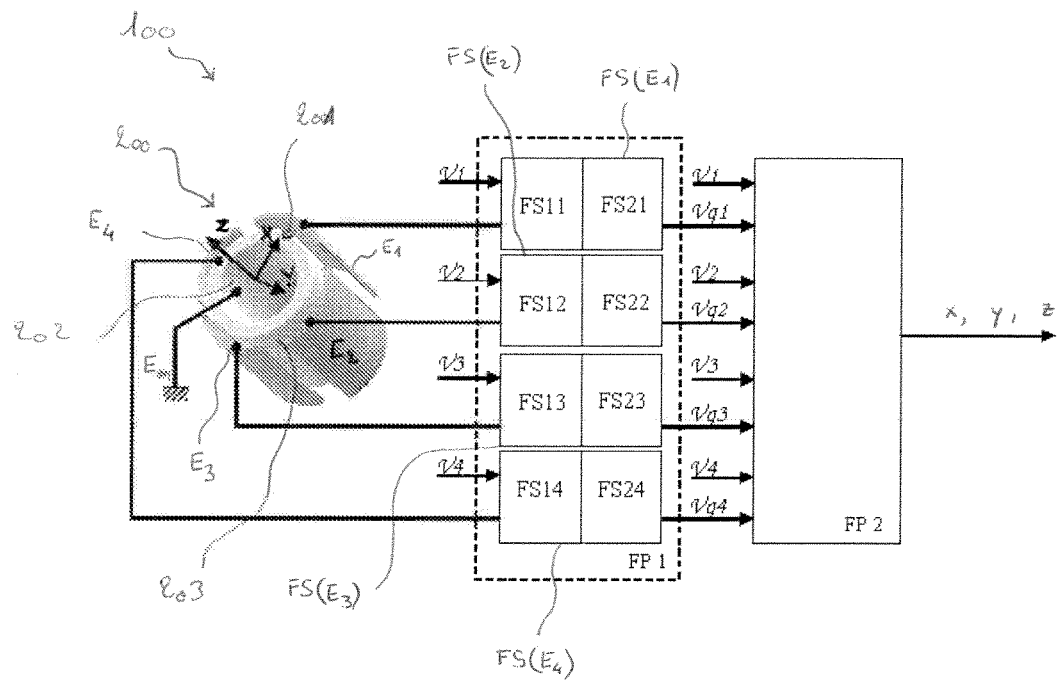
FIG. 1 shows a functional diagram of the means for control and simultaneous measurement, and the means for acquisition, processing and estimation, according to one embodiment.

FIG. 1 shows a functional diagram of the means for control and simultaneous measurement, and the means for acquisition, processing and estimation, according to one embodiment.

More precisely, this figure represents a device 100 for micropositioning a piezoelectric actuator 200, said piezoelectric actuator 200 comprising a piezoelectric material 201 capable of deforming when it is subjected to an electric field.

In this embodiment, the piezoelectric actuator 200 is a piezo tube comprising the piezoelectric material 201 forming the tube, a ground electrode $E_m$ arranged on an internal wall 202 of the tube and four active potential electrodes $E_1$, $E_2$, $E_3$, $E_4$ arranged on different sectors of an external wall 203 of the tube.

The piezo tube is defined in an orthogonal reference frame with axes x, y and z, the z axis being the longitudinal axis of the tubular shape of said piezo tube.

In such a configuration, the application of a voltage to these active potential electrodes $E_1$, $E_2$, $E_3$, $E_4$, and therefore the application of an electric field, makes it possible to impart a longitudinal deformation of the various sectors of the piezoelectric material 201 forming the tube, leading to deflection along the x and y axes as well as contraction or elongation along the z axis.

More precisely, the micropositioning device 100 has two main functions here:
  a first main function FP1 making it possible to control and simultaneously measure a variation in the charge on the various sectors of the piezo tube; and
  a second main function FP2 ensuring the acquisition, processing and estimation of the x, y and z displacements.

Furthermore, the main function FP1 is subdivided into four secondary functions $FS(E_1)$, $FS(E_2)$, $FS(E_3)$, $FS(E_4)$, each associated with one active potential electrode $E_1$, $E_2$, $E_3$, $E_4$.

Furthermore, each of the secondary functions $FS(E_1)$, $FS(E_2)$, $FS(E_3)$, $FS(E_4)$ is subdivided into two secondary functions per active potential electrode $E_1$, $E_2$, $E_3$, $E_4$. Thus, each of the four active potential electrodes $E_1$, $E_2$, $E_3$, $E_4$ respectively fulfills:
  a first secondary function FS11, FS12, FS13, FS14 fulfilled by means for controlling an electric field applied to said piezoelectric actuator 200 so as to deform the piezoelectric material, this first function ensuring said control of the electric field at said piezoelectric actuator (200); and a second secondary function FS21, FS22, FS23, FS24 fulfilled by means for simultaneously measuring a variation in electric charge accumulated on the piezoelectric actuator 200 as a result of the deformation, this second function ensuring said simultaneous electric charge measurement.

Furthermore, the second main function FP2 is fulfilled by means for acquiring the measurements of the electric charge variation, for processing these acquisitions and for estimating a displacement of the piezoelectric actuator 200 and/or an applied force on the basis of the measurement of the variation in electric charge accumulated on the piezoelectric actuator.

Figure 2:
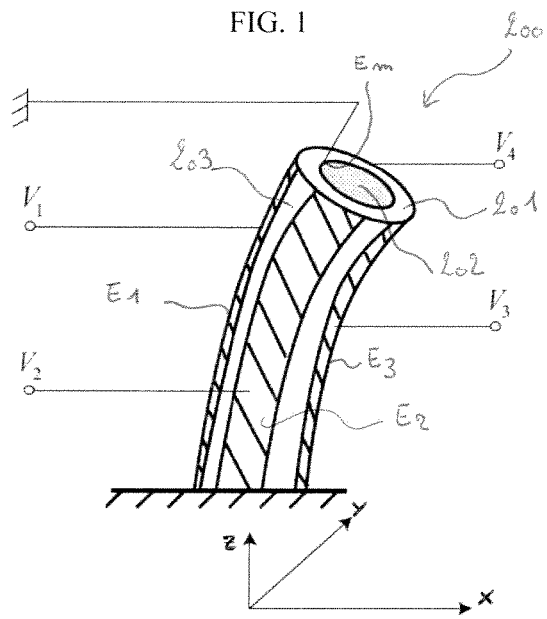
FIG. 2 shows an outline diagram of an actuator according to this embodiment.

FIG. 2 shows a diagram of an actuator according to this embodiment, here a piezo tube. This figure shows the piezoelectric material 201 forming the tube, the ground electrode $E_m$ arranged on the internal wall 202 of the tube and the active potential electrodes $E_1$, $E_2$, $E_3$, $E_4$ arranged on different sectors of the external wall 203 of the tube (only three of the four active potential electrodes are represented here).

Thus, in this figure, $V_1$, $V_2$, $V_3$ and $V_4$ respectively denote the electrical potentials applied to the active potential electrodes $E_1$, $E_2$, $E_3$, $E_4$.

Figure 3:
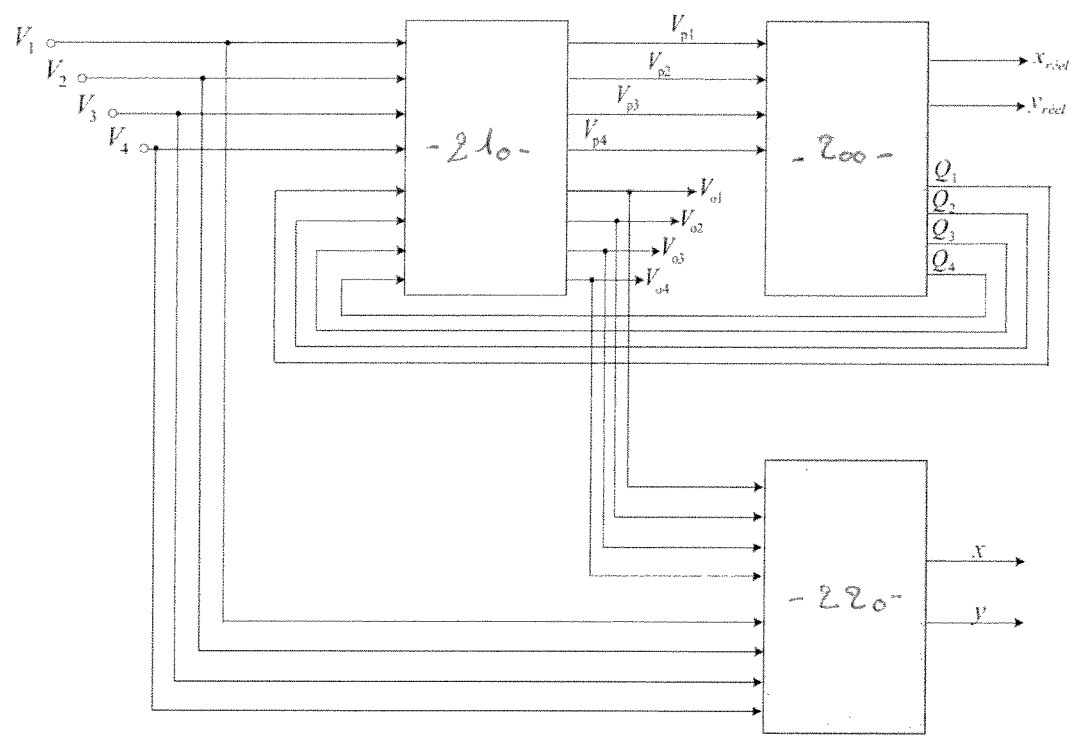
FIG. 3 shows a general structural diagram of a device for micropositioning a piezoelectric actuator according to this embodiment.

FIG. 3 shows a general structural diagram of a device for micropositioning a piezoelectric actuator according to the same embodiment.

More precisely represented in this electrical diagram of the micropositioning device are:

an electrical circuit 210 making it possible to convert the charge variations $Q_i$ measured on the active potential electrode Ei into usable voltage $V_{oi}$;

an observer 220, or estimator, making it possible to provide the values x and y, which are the estimated values of the actual displacements $x_{rel}$ and $Y_{rel}$ at the end of the actuator, on the basis of the available signals, which are the usable voltages $V_{oi}$ and the control voltages $V_i$; and a piezoelectric actuator 200;

where i is in this case an integer between 1 and 4, i being used to reference an electrode $E_i$.

In order to simplify the diagrams illustrated here, the calculation of the estimated value of the z displacement is not described in this case, but is of course estimated in a similar way to the x and y displacements.

Figure 4A:
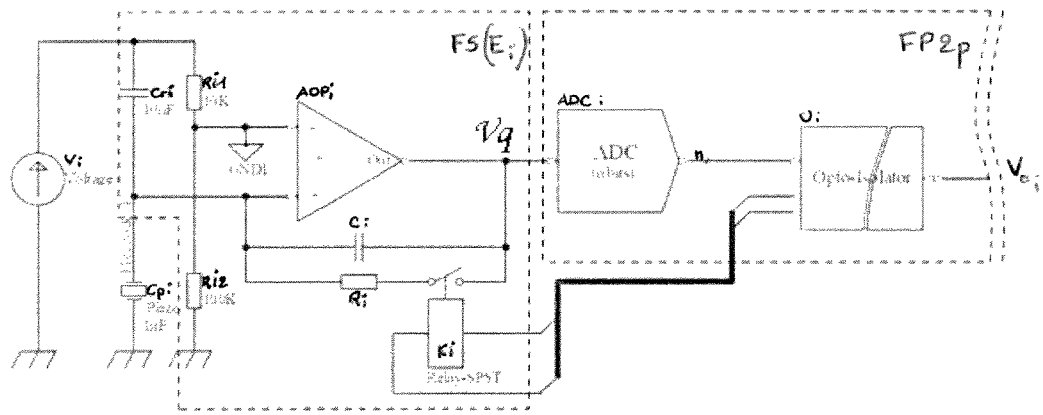
FIGS. 4a and 4b show diagrams of an electrical circuit associated with an electrode according to this embodiment.
Figure 4B:
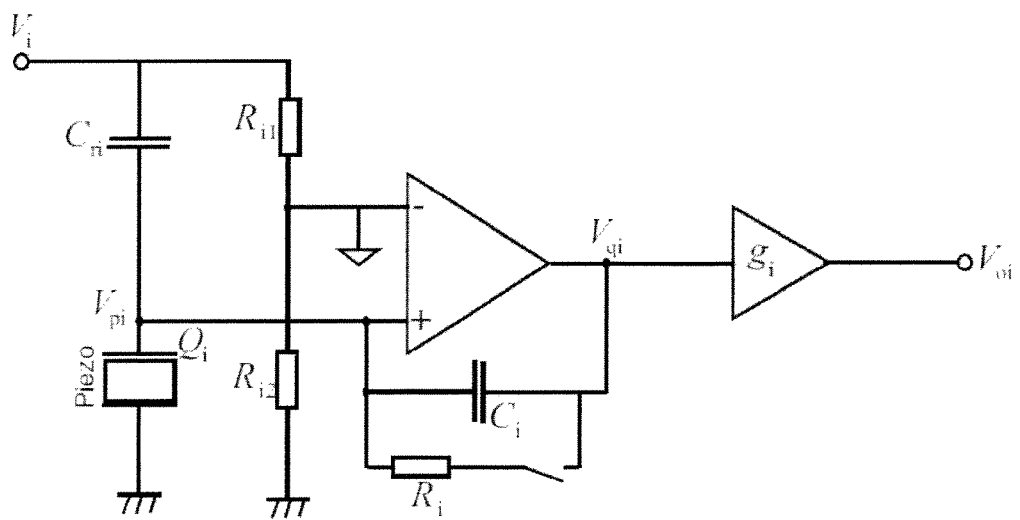

FIGS. 4a and 4b show diagrams of an electrical circuit associated with an electrode according to this embodiment.

More precisely, FIG. 4a illustrates an electrical circuit of an electrode $E_i$ making it possible to fulfill both the first secondary function FS1i and the second secondary function FS2i, these two secondary functions being grouped as a secondary function associated with an electrode E and denoted by FS($E_i$).

A partial electrical circuit is illustrated, which partially fulfills the main function FP2, here denoted by FP2p.

Thus, FIG. 4a details the circuit diagram of a secondary function FS($E_i$) associated with an electrode $E_i$, i being an integer between 1 and 4, applicable for a sector of the piezo tube.

The index i representing the channel number will not be repeated in the rest of the explanation, in order to simplify the notation.

Each sector of the piezo tube is denoted by "Piezo", and is likened to a capacitor $C_p$.

A charge Q is applied to each sector of the actuator by means of the voltage V, via a capacitor $C_r$. The latter is selected for its low losses. It is therefore considered as being linear and stable.

Its value is such that most of the input voltage V is found on the piezoelectric actuator. A ratio of one tenth is satisfactory, although any other ratio is possible.

The voltage V also supplies a divider bridge composed of $R_{i1}$ and $R_{i2}$ (i is again the channel number from 1 to 4), denoted below by $R_1$ and $R_2$, ensuring equilibrium between the two branches of the bridge if $$\frac{R_1}{R_2} = \frac{C_p}{C_r}.$$

Any modifications of the capacitance $C_p$, resulting from deformations of each sector, modify the equilibrium of the charges, which will then be measured by the charge amplifier composed of the circuit of the operational amplifier, denoted by AOP, and the capacitor C.

The resistor R and the switch K, allow full resetting to zero of the charges present on the plates of the measurement capacitor C.

The diagram of FIG. 4a may be likened to the diagram of FIG. 4b, where $g_i$ is a gain to be identified. This gain includes a gain in an opto-coupler, a gain in an analog-digital converter and possibly an adjustment gain in an integrator circuit.

More precisely, the various signals and variables of FIG. 4b are listed below:

$V_i$ is the control potential,
$V_{pi}$ is the potential found on the electrode $E_i$,
$V_{qi}$ is the potential at the output of the operational amplifier AOP$_i$,
$V_{oi}$ is the usable potential found at the output of the electrical circuit,
$Q_i$ indicates the charges appearing on the electrode $E_i$,
$C_{ri}$ is a capacitor for a divider bridge,
$C_{pi}$ is an equivalent static capacitance of the piezoelectric actuator in its electrode $E_i$ part,
$C_i$ is a capacitor for measuring variations in charges,
$R_{i1}$ and $R_{i2}$ are two resistors for the divider bridge at the input of the operational amplifier AOP$_i$,
$R_i$ is a discharge resistance,
$g_i$ is the gain.

In this embodiment, the operation of the device for micropositioning the piezoelectric actuator is governed by electrical equations and piezoelectric equations. These equations are subsequently used in order to derive the observer, or the estimator.

We recall that, in FIG. 4b which illustrates the electrical diagram for the electrode i, $V_{pi}$ is the voltage across the terminals of the actuator, electrode i part, $V_{ci}$ is the voltage across the terminals of the capacitor $C_i$, $i_i$ is the current which flows through the capacitor $C_{ri}$, $i_{ci}$ is the current which flows through the capacitor $C_i$, and $i_{pzti}$ is the current which flows through the actuator via the electrode i.

The electrical equations are then more precisely:
the equations of the input voltages;
the equation of the voltage c; and
the equation of the usable output voltage $V_{oi}$.

More precisely, the equations of the input voltages are defined by the relations between the voltages at the input of the operational amplifier, including the resistive divider, which are as follows:

$$\begin{cases} V_{pi} = V_+ \\ V_+ = V_- \\ V_- = \dfrac{R_{i2}}{(R_{i1} + R_{i2})} V_i \end{cases} \quad [1]$$

where $V_+$ and $V_-$ are the voltages at the input of the operational amplifier.

Furthermore, the equation of the voltage $V_{ci}$ is linked with the charge $Q_{ci}$ on the capacitor $C_i$ by the following relation:

$$V_{ci} = \frac{1}{C_i} Q_{ci} = \frac{1}{C_i} \int_0^t i_{ci} \, dt \quad [2]$$

Now:

$$i_{ci} = i_i - i_{pzti} - i_{biasi} \quad [3]$$

where $i_{biasi}$ is the leakage current in the operational amplifier.

Furthermore, the current in the relation linking the current $i_{pzt}$ in the actuator and the charges thereon is:

$$\int_0^t i_{pzti} \, dt = Q_{defi} + Q_{DAi} + \int_0^t i_{leaki} \, dt \quad [4]$$

where $Q_{defi}$ is the charge generated by the application of the voltage $V_{pi}$ and by the deformation of the actuator, $Q_{DAi}$ is the charge due to the dielectric absorption of the material (201) and $i_{leaki}$ is the leakage current. These quantities may have positive or negative gains. The leakage current $i_{leaki}$ is linked with the leakage resistance $R_{fpi}$ in the actuator as follows:

$$i_{leaki} = \frac{V_{pi}}{R_{fpi}} \quad [5]$$

By using Equations 2, 3, 4 and 5, it is possible to deduce therefrom the voltage $V_{ci}$:

$$V_{ci} = \frac{1}{C_i} \left( \int_0^t i_i \, dt - Q_{defi} - Q_{DAi} - \int_0^t \frac{V_{pi}}{R_{fpi}} \, dt - \int_0^t i_{biasi} \, dt \right) \quad [6]$$

Now, according to FIG. 4a, the currents $i_i$ are as follows:

$$i_i = C_{ri} \frac{d(V_i - V_{pi})}{dt} \Leftrightarrow \int_0^t i_i \, dt = C_{ri}(V_i - V_{pi}) \quad [7]$$

and according to equation 1 the voltage $V_{pi}$ is:

$$V_{pi} = \frac{R_{i2}}{(R_{i1} + R_{i2})} V_i \quad [8]$$

which, using Equations 7 and 8, leads to:

$$\int_0^t i_i \, dt = \frac{C_{ri} R_{i1}}{(R_{i1} + R_{i2})} V_i \quad [9]$$

By using Equations 6, 8 and 9, it is possible to deduce the final equation of the voltage $V_{ci}$:

$$V_{ci} = \frac{1}{C_i} \left( \frac{C_{ri} + R_{i1}}{(R_{i1} + R_{i2})} V_i - Q_{defi} - Q_{DAi} - \frac{R_{i2}}{R_{fpi}(R_{i1} + R_{i2})} \int_0^t V_i \, dt - \int_0^t i_{biasi} \, dt \right) \quad [10]$$

Furthermore, the equation of the usable output voltage $V_{oi}$ may be deduced from the equations linking the voltages $V_{oi}$, $V_{ci}$ and $V_{pi}$, which are as follows:

$$\begin{cases} \dfrac{V_{oi}}{g_i} = V_{qi} \\ V_{qi} + V_{ci} - V_+ = 0 \end{cases} \Rightarrow V_{oi} = g_i(V_+ - V_{ci}) \quad [11]$$

By using Equations I and II, the voltage $V_{oi}$ can be defined as follows:

$$V_{oi} = g_i \left( \frac{R_{i2}}{(R_{i1} + R_{i2})} V_i - V_{ci} \right) \quad [12]$$

By combining Equations 10 and 12, the following equation of the usable voltage $V_{oi}$ is obtained:

$$V_{oi} = g_i \left[ \frac{R_{i2}}{(R_{i1} + R_{i2})} V_i - \frac{1}{C_i} \left( \frac{C_{ri} R_{i1}}{(R_{i1} + R_{i2})} V_i - Q_{defi} - Q_{DAi} - \frac{R_{i2}}{R_{fpi}(R_{i1} + R_{i2})} \int_0^t V_i \, dt - \int_0^t i_{biasi} \, dt \right) \right] \quad [13]$$

As regards the piezoelectric equations, these are more precisely the equations making it possible to calculate the charges on the electrodes.

The relation which links the x deflection at the end of the piezoelectric actuator, here of the piezo tube type, and the voltages $V_1$ and $V_3$ respectively applied to the electrodes 1 and 3 is given by the following equation:

$$x = aV_1 - aV_3 \Leftrightarrow (V_1 - V_3) = \frac{x}{a} \quad [14]$$

where a is the piezoelectric coefficient for a unipolar control, that is to say $U_1$ is not necessarily equal to $-U_3$. This coefficient is available in numerous articles, such as the article "Introduction to Scanning Tunneling Microscopy" by C. J. Chen and published in the review Oxford University Press in 1993. The same relation is obtained for the y axis:

$$y = aV_2 - aV_4 \Leftrightarrow (V_2 - V_4) = \frac{y}{a} \quad [15]$$

Furthermore, by assuming the charges $Q_{def1}$ and $Q_{def3}$:
- on the electrodes to be identical ($a_1 = a_3 = a$) and antagonistic 1 and 3 for the x axis; and
- on the electrodes to be identical ($\beta_2 = \beta_4 = \beta$) and antagonistic 2 and 4 for the y axis;

written parametrically with respect to the voltages $U_i$ (i here being an integer between 1 and 4), and taking the symmetry of the actuator into account, we obtain:

$$\begin{cases} Q_{def1} = \alpha V_1 - \alpha V_3 + \beta V_2 - \beta V_4 = \alpha(V_1 - V_3) + \beta(V_2 - V_4) \\ Q_{def3} = -\alpha V_1 - \alpha V_3 + \beta V_2 - \beta V_4 = -\alpha(V_1 - V_3) + \beta(V_2 - V_4) \end{cases} \quad [16]$$

The same equation can be written for the charges $Q_{def2}$ and $Q_{def4}$ for the y axis:

$$\begin{cases} Q_{def2} = \alpha V_2 - \alpha V_4 + \beta V_1 - \beta V_3 = \alpha(V_2 - V_4) + \beta(V_1 - V_3) \\ Q_{def4} = -\alpha V_2 + \alpha V_4 + \beta V_1 - \beta V_3 = -\alpha(V_2 - V_4) + \beta(V_1 - V_3) \end{cases} \quad [17]$$

By introducing Equations 14 and 15 into Equations 16 and 17, we obtain the equations of the charges on the electrodes:

$$\begin{cases} Q_{def1} = \alpha \frac{x}{a} + \beta \frac{y}{a} \\ Q_{def3} = -\alpha \frac{x}{a} + \beta \frac{y}{a} \\ Q_{def2} = \alpha \frac{y}{a} + \beta \frac{x}{a} \\ Q_{def4} = -\alpha \frac{y}{a} + \beta \frac{x}{a} \end{cases} \quad [18]$$

By combining the electrical and piezoelectric equations, that is to say by introducing the equations of the charges on the electrodes (Equation 18) into the equation of the usable voltage $V_{oi}$ (Equation 13), we obtain:

$$\frac{V_{o1}}{g_1} = \frac{R_{12}}{(R_{11} + R_{12})} V_1 - \frac{C_{r1} R_{11}}{C_1(R_{11} + R_{12})} V_1 + \quad [19]$$

$$\frac{1}{C_1}\left(\alpha\frac{x}{a} + \beta\frac{y}{a} + Q_{DA1} + \frac{R_{12}}{R_{fp1}(R_{11}+R_{12})}\int_0^t V_1 dt + \int_0^t i_{bias1} dt\right)$$

$$\frac{V_{o3}}{g_3} = \frac{R_{32}}{(R_{31} + R_{32})} V_3 - \frac{C_{r3} R_{31}}{C_2(R_{31} + R_{32})} V_3 +$$

$$\frac{1}{C_3}\left(-\alpha\frac{x}{a} + \beta\frac{y}{a} + Q_{DA3} + \frac{R_{32}}{R_{fp3}(R_{31}+R_{32})}\int_0^t V_3 dt + \int_0^t i_{bias3} dt\right)$$

$$\frac{V_{o2}}{g_2} = \frac{R_{22}}{(R_{21} + R_{22})} V_2 - \frac{C_{r2} R_{21}}{C_3(R_{21} + R_{22})} V_2 + \frac{1}{C_2}\left(\alpha\frac{y}{a} + \beta\frac{x}{a} + Q_{DA2} + \right.$$

$$\left. \frac{R_{22}}{R_{fp3}(R_{21}+R_{22})}\int_0^t V_2 dt + \int_0^t i_{bias2} dt\right)$$

$$\frac{V_{o4}}{g_4} = \frac{R_{42}}{(R_{41} + R_{42})} V_4 - \frac{C_{r4} R_{41}}{C_4(R_{41} + R_{42})} V_4 + \frac{1}{C_4}\left(-\alpha\frac{y}{a} + \beta\frac{x}{a} + \right.$$

$$\left. Q_{DA4} + \frac{R_{42}}{R_{fp4}(R_{41}+R_{42})}\int_0^t V_4 dt + \int_0^t i_{bias4} dt\right)$$

Assuming the following equations:

$$\begin{cases} C_1 = C_2 = C_3 = C_4 = C \\ g_1 = g_2 = g_3 = g_4 = g \\ \gamma_i = \frac{R_{i2}}{(R_{i1} + R_{i2})} - \frac{C_{ri} R_{i1}}{C_i(R_{i1} + R_{i2})} \\ \lambda_i = \frac{R_{i2}}{R_{fpi}(R_{i1} + R_{i2})} \end{cases} \quad [20]$$

we obtain the equations given below:

$$\frac{V_{o1}}{g} = \gamma_1 V_1 + \frac{1}{C}\left(\alpha\frac{x}{a} + \beta\frac{y}{a} + Q_{DA1} + \lambda_1 \int_0^t V_1 dt + \int_0^t i_{bias1} dt\right) \quad [21]$$

$$\frac{V_{o3}}{g} = \gamma_3 V_3 + \frac{1}{C}\left(-\alpha\frac{x}{a} + \beta\frac{y}{a} + Q_{DA3} + \lambda_3 \int_0^t V_3 dt + \int_0^t i_{bias3} dt\right)$$

$$\frac{V_{o2}}{g} = \gamma_2 V_2 + \frac{1}{C}\left(\alpha\frac{y}{a} + \beta\frac{x}{a} + Q_{DA2} + \lambda_2 \int_0^t V_2 dt + \int_0^t i_{bias2} dt\right)$$

$$\frac{V_{o4}}{g} = \gamma_4 V_4 + \frac{1}{C}\left(-\alpha\frac{y}{a} + \beta\frac{x}{a} + Q_{DA4} + \lambda_4 \int_0^t V_4 dt + \int_0^t i_{bias4} dt\right)$$

Lastly, on the basis of Equation 21, it is possible to calculate the differences $(V_{o1}-V_{o3})$ and $(V_{o2}-V_{o4})$ as follows:

$$\begin{cases} V_{o1} - V_{o3} = g(\gamma_1 V_1 - \gamma_3 V_3) + \frac{2g\alpha}{aC}x + \frac{g}{C}(Q_{DA1} - Q_{DA3}) + \\ \frac{g}{C}\int_0^t (i_{bias1} - i_{bias3}) dt + \frac{g}{C}\int_0^t (\lambda_1 V_1 - \lambda_2 V_2) dt \\ V_{o2} - V_{o4} = g(\gamma_2 V_2 - \gamma_4 V_4) + \frac{2g\alpha}{aC}y + \frac{g}{C}(Q_{DA2} - Q_{DA4}) + \\ \frac{g}{C}\int_0^t (i_{bias2} - i_{bias4}) dt + \frac{g}{C}\int_0^t (\lambda_2 V_2 - \lambda_4 V_4) dt \end{cases} \quad [22]$$

It is furthermore assumed that the charge $Q_{DAi}(t)$ due to the dielectric absorption can be approximated by a first-order system. In Laplace space, this gives:

$$Q_{DAi}(s) = \frac{k_{DAi}}{(1 + \tau_{DAi}s)} V_i(s) = Q_{tfDAi}(s) V_i(s) \quad [23]$$

where s is the Laplace variable, $k_{DAi}$ is the static gain (which may be positive or negative in our case) and $\tau_{DAi}$ is the time constant. $Q_{tfDAi}(s)$ is the transfer function which links the charge $Q_{DAi}(s)$ with the input voltage $V_i(s)$.

Consequently, by virtue of all these equations, it is thus possible to deduce the equations of the observer, or estimator. In particular, on the basis of Equation 22, the x and y displacements are governed by the following equations:

$$\begin{cases} x = \frac{a}{2\alpha}\left[\frac{C}{g}(V_{o1} - V_{o3}) - C(\gamma_1 V_1 - \gamma_3 V_3) - (Q_{DA1} - Q_{DA3}) - \\ \int_0^t (i_{bias1} - i_{bias3}) dt - \int_0^t (\lambda_1 V_1 - \lambda_3 V_3) dt\right] \\ y = \frac{a}{2\alpha}\left[\frac{C}{g}(V_{o2} - V_{o4}) - C(\gamma_2 V_2 - \gamma_4 V_4) - (Q_{DA2} - Q_{DA4}) - \\ \int_0^t (i_{bias2} - i_{bias4}) dt - \int_0^t (\lambda_2 V_2 - \lambda_4 V_4) dt\right] \end{cases} \quad [24]$$

Figure 5:
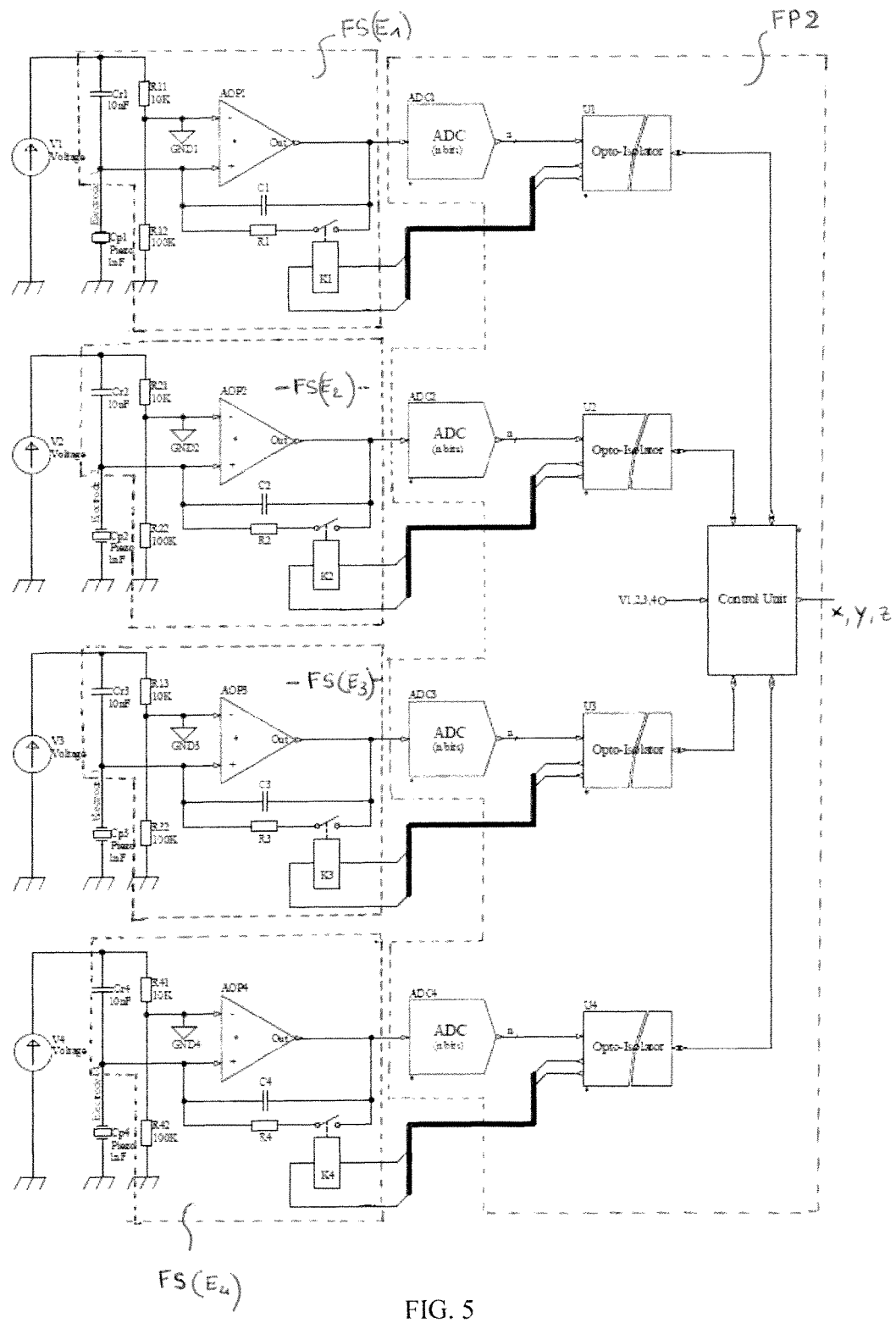
FIG. 5 shows a diagram of an overall electrical circuit associated with a piezoelectric actuator of the piezo tube type according to this embodiment.

FIG. 5 shows a diagram of an overall electrical circuit associated with a piezoelectric actuator of the piezo tube type according to this embodiment.

Specifically, this figure represents four circuit diagrams of the secondary functions $FS(E_1)$, $FS(E_2)$, $FS(E_3)$, $FS(E_4)$ as illustrated in FIG. 4a, each respectively associated with the active potential electrodes $E_1$, $E_2$, $E_3$, $E_4$ arranged on various sectors of the external wall 203 of the piezoelectric material 201 forming the tube.

Furthermore, each of these electrical circuits fulfilling said secondary functions $FS(E_1)$, $FS(E_2)$, $FS(E_3)$, $FS(E_4)$ is connected in series with another electrical circuit which, for its part, associated with a control unit, fulfills the second main function FP2, in particular ensuring the acquisition, processing and estimation of the x, y displacements, the values x and y being the estimated values of the actual displacements $x_{rel}$ and $y_{rel}$.

In order to simplify the diagrams illustrated here, the calculation of the estimated value of the z displacement is not described, but is of course estimated in a similar way.

Figure 6:
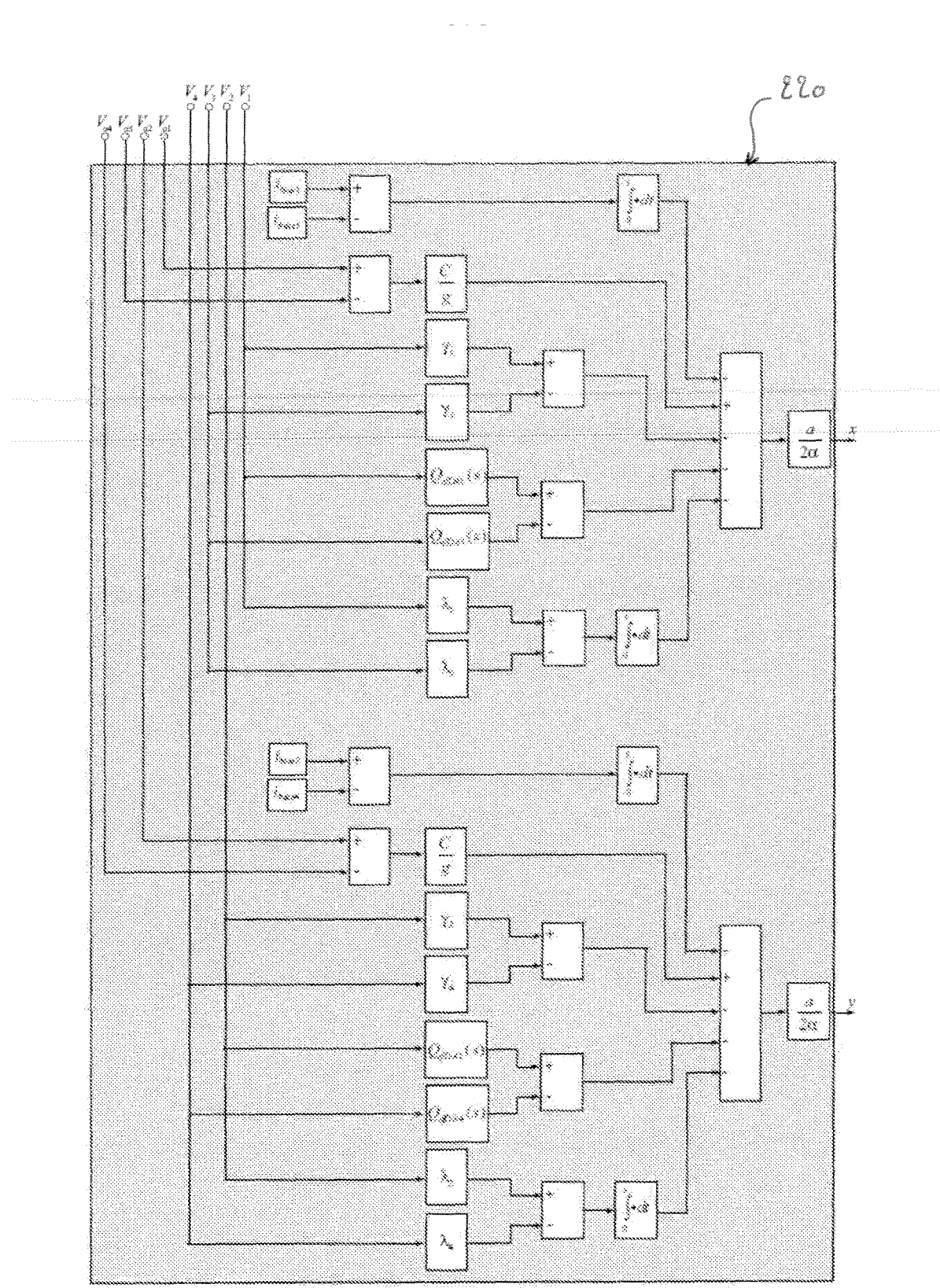
FIG. 6 shows a detailed block diagram of an observer, or estimator, according to this embodiment.

FIG. 6 shows a detailed block diagram of an observer, or estimator, according to this embodiment, by which the mathematical operations carried out as described above make it possible to measure at the output the x and y displacements which are governed by Equation 24.

Numerous modifications may be made to the particular embodiment described above without departing from the scope of the invention.

For instance, the number of electrodes may vary as a function of the number of measurements desired.

Furthermore, the electrical diagrams may differ without departing from the scope of the invention, so long as the electrical circuits are suitable for fulfilling the same functions and aim to achieve equivalent results.

The invention claimed is:

1. A micropositioning device for a piezoelectric actuator that includes at least one piezoelectric material capable of deforming when it is subjected to an electric field, the device comprising:
   means for controlling an electric field applied to the piezoelectric actuator so as to deform the piezoelectric material, and
   means for simultaneously measuring a variation in electric charge accumulated on the piezoelectric actuator as a result of the deformation; and
   means for acquiring measurements of the electric charge variation, for processing these acquisitions and for estimating a displacement (x, y, z) of the piezoelectric actuator and/or an applied force on the basis of the measurement of the variation in electric charge accumulated on the piezoelectric actuator, wherein the means for controlling and the means for measuring further comprises:
     a voltage generator connected in parallel to a divider bridge being composed of a first resistor and a second resistor in series, and to a first capacitor connected in series with the piezoelectric actuator,
     a charge amplifier having a first input connected to a node between the two resistors, forming a virtual ground at floating high potential, and a second input connected to a node between the first capacitor and the piezoelectric actuator,
     wherein the charge amplifier comprises an operational amplifier and a second capacitor connected between the second input and the output of the operational amplifier and the control and measurement means comprises a circuit for resetting to zero the charges present on the second capacitor.

2. The micropositioning device of claim 1, wherein the piezoelectric actuator comprises at least three electrodes, including at least one ground electrode and at least two active potential electrodes.

3. The micropositioning device of claim 2, wherein the piezoelectric actuator is a piezo tube comprising the piezoelectric material forming the tube, the ground electrode is arranged on an internal wall of the tube and at least two active potential electrodes are arranged on an external wall of the tube.

4. The micropositioning device of claim 1, wherein the means for controlling the electric field and the means for simultaneously measuring the variation in the electric charge comprise at least one circuit for controlling the electric field applied to the piezoelectric actuator and for measuring the variation of charge accumulated on the active potential electrodes.

5. The micropositioning device of claim 1, wherein the piezoelectric device, at rest, functions as a capacitor, the first capacitor and the first and second resistors are selected so that the ratio between the first and the second resistor is substantially equal to the ratio between the first capacitor and the capacitor of the piezoelectric device at rest.

6. The micropositioning device of claim 1, wherein the first capacitor is selected so as to have a leakage resistance of more than 100 Gohm.

7. The micropositioning device of claim 1, wherein the first capacitor is selected so that at least 50% of the voltage delivered by the voltage generator is found on the piezoelectric device.

8. The micropositioning device of claim 1, wherein the output of each charge amplifier is connected to an analog-digital converter connected to a computer via galvanic isolation circuits; the computer estimating the displacement of the actuator and/or the deformation of the materials and/or the applied force on the basis of the charge variation received from the charge amplifiers and the voltages applied by the voltage generators.

9. The micropositioning device of claim 1, wherein the piezoelectric device comprises at least three electrodes, including at least one ground electrode and at least two active potential electrodes, the device comprising as many control and measurement means as active electrodes, connected one by one, and the control and measurement means being connected to a single computer adapted to displace and measure the piezoelectric device in at least two dimensions.

10. A method for micropositioning at least one piezoelectric actuator that includes at least one piezoelectric material capable of deforming when it is subjected to an electric field and includes:
   means for controlling an electric field applied to the piezoelectric actuator so as to deform the piezoelectric material, and
   means for simultaneously measuring a variation in electric charge accumulated on the piezoelectric actuator as a result of the deformation; and
   means for acquiring measurements of the electric charge variation, for processing these acquisitions and for estimating a displacement (x, y, z) of the piezoelectric actuator and/or an applied force on the basis of the measurement of the variation in electric charge accumulated on the piezoelectric actuator, wherein the means for controlling and the means for measuring further includes:
     a voltage generator connected in parallel to a divider bridge being composed of a first resistor and a second resistor in series, and to a first capacitor connected in series with the piezoelectric actuator,
     a charge amplifier having a first input connected to a node between the two resistors, forming a virtual ground at floating high potential, and a second input connected to a node between the first capacitor and the piezoelectric actuator,
     wherein the charge amplifier comprises an operational amplifier and a second capacitor connected between the second input and the output of the operational amplifier and the control and measurement means comprises a circuit for resetting to zero the charges present on the second capacitor, comprising the following steps:

controlling, by the control means, the piezoelectric actuator by applying an electric field to the piezoelectric actuator so as to deform the piezoelectric material; and simultaneously measuring, by simultaneous measurement means, a variation in electric charge accumulated on the piezoelectric actuator as a result of the deformation wherein at least one step includes acquiring the measurements of the electric charge variation, processing these acquisitions and of estimating (i) a displacement (x, y, z) of the piezoelectric actuator and/or (ii) an applied force on the basis of the measurement of the variation in electric charge accumulated on the piezoelectric actuator.

* * * * *